(12) United States Patent
Niwa et al.

(10) Patent No.: US 11,062,876 B2
(45) Date of Patent: Jul. 13, 2021

(54) EVALUATION METHOD AND EVALUATION APPARATUS FOR ELECTRONIC DEVICE

(71) Applicants: Tohoku University, Miyagi (JP); Toray Research Center, Inc., Toyko (JP)

(72) Inventors: Masaaki Niwa, Miyagi (JP); Tetsuo Endoh, Miyagi (JP); Shoji Ikeda, Miyagi (JP); Kosuke Kimura, Shiga (JP)

(73) Assignee: TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 16/360,516

(22) Filed: Mar. 21, 2019

(65) Prior Publication Data
US 2019/0304741 A1    Oct. 3, 2019

(30) Foreign Application Priority Data

Mar. 22, 2018 (JP) .............................. JP2018-055270

(51) Int. Cl.
| | |
|---|---|
| H01J 37/22 | (2006.01) |
| G01N 23/20091 | (2018.01) |
| H01J 37/28 | (2006.01) |
| H01L 27/22 | (2006.01) |
| H01L 43/02 | (2006.01) |

(52) U.S. Cl.
CPC ...... *H01J 37/222* (2013.01); *G01N 23/20091* (2013.01); *H01J 37/28* (2013.01); *H01J 2237/221* (2013.01); *H01J 2237/24485* (2013.01); *H01J 2237/2802* (2013.01); *H01L 27/222* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 9,536,666 B2 * | 1/2017 | Teraoka | H01G 4/1209 |
| 2015/0279565 A1 * | 10/2015 | Teraoka | H01G 4/1227 |
| | | | 361/301.4 |
| 2016/0025659 A1 * | 1/2016 | Ominami | G01N 23/2251 |
| | | | 250/307 |
| 2017/0330724 A1 * | 11/2017 | Okumura | H01J 37/20 |

FOREIGN PATENT DOCUMENTS

JP    2007073907 A    3/2007

OTHER PUBLICATIONS

Ohsawa et al. ("Precise Damage Observation in Ion-Beam Etched MTJ," IEEE Transactions on Magnetics, vol. 52, Mo. 7, Jul. 2016).*
Ohsawa, Y., et al. "Precise Damage Observation in Ion-Beam Etched MTJ," IEEE Transactions on Magnetics, vol. 52, No. 7, Jul. 2016.

* cited by examiner

*Primary Examiner* — Andrew Smyth
(74) *Attorney, Agent, or Firm* — Fox Rothschild LLP; Robert J. Sacco; Carol E. Thorstad-Forsyth

(57) ABSTRACT

An evaluation method for an electronic device provided with an insulating film between a pair of electrode layers includes preparing a sample that has a tunnel barrier insulating film as the insulating film; irradiating the sample with electron beams from a plurality of angles to acquire a plurality of images; and performing image processing using the plurality of images to reconstruct a stereoscopic image and generate a cross-sectional image of the sample from the stereoscopic image.

15 Claims, 16 Drawing Sheets

EVALUATION METHOD AND EVALUATION APPARATUS FOR ELECTRONIC DEVICE

BACKGROUND OF THE INVENTION

Field of the Invention

The present invention relates to an evaluation method and an evaluation apparatus for an electronic device.

Description of the Related Art

A memory equipped with a magnetoresistive random access memory (MRAM) using spin transfer torque (STT), namely an STT-MRAM, is being mass-produced as a next-generation nonvolatile storage element. As an electronic device for storage to be used for the STT-MRAM, for example, a magnetic tunnel junction element (hereinafter referred to as MTJ element) is known. The MTJ element is configured to have a tunnel barrier insulating film provided between a reference layer and a recording layer. In an MTJ element manufacturing process, a lower electrode, the reference layer, the tunnel barrier insulating film, a recording layer, and an upper electrode are stacked in the order mentioned on a wafer, which is then processed into a predetermined shape by etching, followed by formation of an interlayer insulating film, a contact, wiring, and the like.

A defect may occur in the MTJ element for the following reasons: generation of a conductive foreign body that short-circuits the reference layer and the recording layer (hereinafter referred to as conductive foreign object); generation of an insulating foreign body that causes degradation in crystallinity of the tunnel barrier insulating film (hereinafter referred to as insulating foreign object); etching damage; and degradation in insulating properties of the tunnel barrier insulating film due to the uneven surface of the tunnel barrier insulating film attributable to the unevenness of the lower electrode. As an analysis technique for such a defect, as described in "Precise damage observation in ion-beam etched MTJ" (written by Yuichi Ohsawa, Naoharu Shimomura, Tadaomi Daibou, Yuzo Kamiguchi, Satoshi Shirotori, Tomoaki Inokuchi, Daisuke Saida, Buyandalai Altansargai, Yushi Kato, Hiroaki Yoda, Tadakatsu Ohkubo, and Kazuhiro Hono, published in IEEE TRANSACTIONS ON MAGNETICS, Vol. 52, No. 7, July 2016), there is a method of processing the MTJ element into a flake in a direction vertical to the film surface of the tunnel barrier insulating film with a focused ion beam (FIB) apparatus to prepare a sample and observing a vertical cross-sectional image of the sample with a transmission electron microscope.

Further, as described in Japanese Patent Laid-Open No. 2007-073907, there is also known a technique in which the impedance of the MTJ element is measured to estimate the flatness of the surface of the lower electrode and analyze a cause of the defect.

SUMMARY OF THE INVENTION

However, in the defect analysis technique described in "Precise damage observation in ion-beam etched MTJ", it is difficult to horizontally process the portion of the tunnel barrier insulating film into a flake and cut out a horizontal cross-section, and it is thus difficult to confirm the unevenness over the entire surface of the tunnel barrier insulating film. In addition, in the defect analysis technique described in "Precise damage observation in ion-beam etched MTJ", it is necessary to prepare a plurality of samples on the cross-sections at different positions, and hence a single place cannot be specified as the place of the foreign object. In the defect analysis technique described in Japanese Patent Laid-Open No. 2007-073907, it is not possible to confirm the position of the foreign object, the etching damage, or the unevenness of the tunnel barrier insulating film. Accordingly, the defect analysis technique described in each of Japanese Patent Laid-Open No. 2007-073907 and "Precise damage observation in ion-beam etched MTJ" has difficulties in specifying a cause of degradation in insulating properties of the tunnel barrier insulating film and is thus insufficient for accurately evaluating the quality of the electronic device. Especially in the MTJ element, since the tunnel barrier insulating film is formed on polycrystal having a grain boundary, the unevenness of the tunnel barrier insulating film greatly influences the insulating properties.

It is an object of the present invention to provide an evaluation method and an evaluation apparatus for an electronic device which are capable of accurately evaluating the quality of the electronic device.

An evaluation method for an electronic device according to the present invention is an evaluation method for an electronic device provided with an insulating film between a pair of electrode layers, the method includes: preparing a sample that has the insulating film; irradiating the sample with electron beams from a plurality of angles to acquire a plurality of images; and performing image processing using the plurality of images to reconstruct a stereoscopic image and generate a cross-sectional image of the sample from the stereoscopic image.

An evaluation apparatus for an electronic device according to the present invention is an evaluation apparatus for an electronic device provided with an insulating film between a pair of electrode layers, the apparatus includes: an electron source is configured to output electron beams to the sample having the insulating film from a plurality of angles; an image acquisition unit is configured to detect the electron beams transmitted through the sample to acquire a plurality of images; and an image processing unit is configured to reconstruct a stereoscopic image of the sample from the plurality of images and generates a cross-sectional image of the sample from the stereoscopic image.

According to the present invention, the cross-sectional image of the sample is generated from the stereoscopic image of the sample, so that the quality of the electronic device can be evaluated accurately.

DETAILED DESCRIPTION OF THE PREFERRED EMBODIMENT

Figure 1:
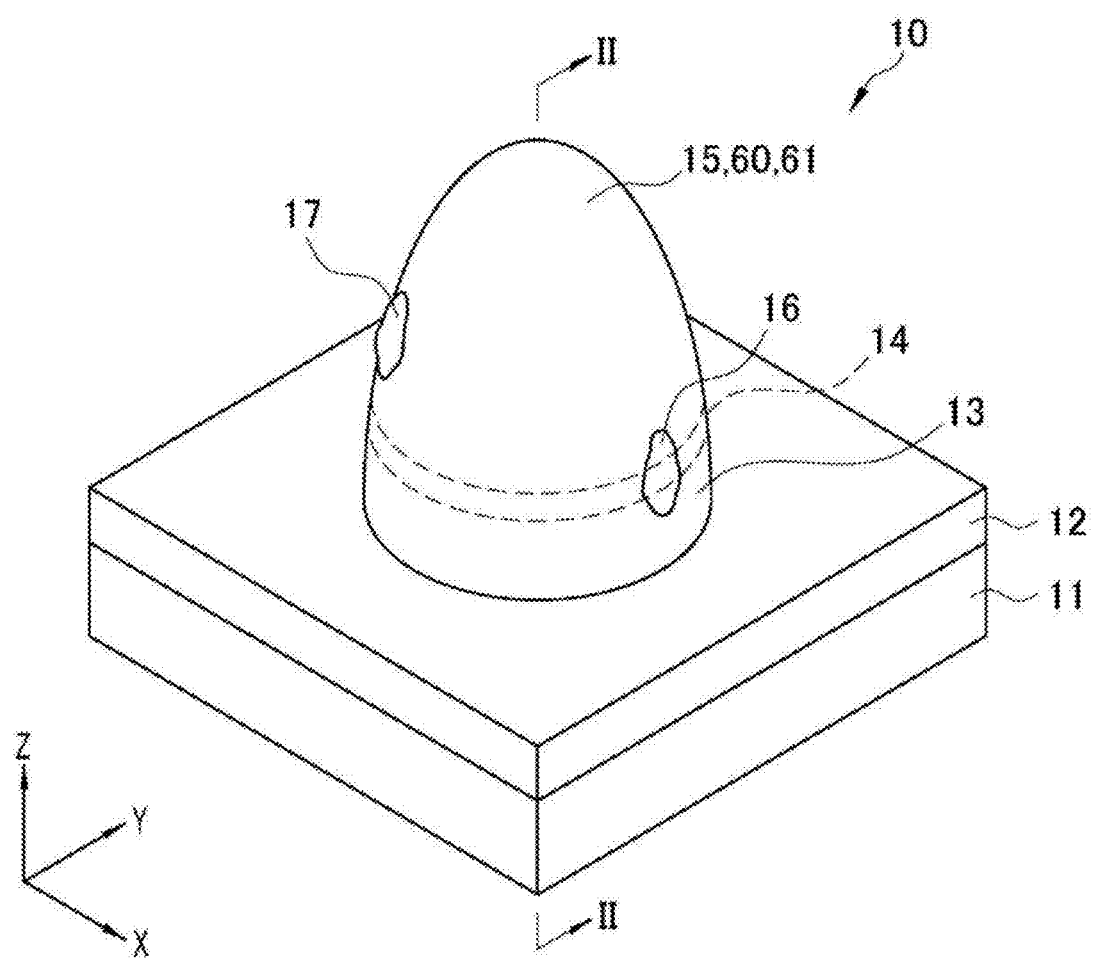
FIG. 1 is a schematic view of an MTJ element in which the present invention has been implemented.

FIG. 1 is a schematic view of an MTJ element 10 in which the present invention has been implemented. The MTJ element 10 is an example of an electronic device provided with an insulating film between a pair of electrode layers. The MTJ element 10 is formed on a wafer 11. A plurality of element formation areas (not shown) are provided on the wafer 11, and a plurality of MTJ elements 10 are formed in one element formation area.

The MTJ element 10 is formed on the wafer 11 by a known manufacturing process. For example, the MTJ element 10 is formed as follows. A lower electrode 12, a reference layer 13, a tunnel barrier insulating film 14 as an insulating film, a recording layer 15, a cap layer 60 including an etch stopper, and an upper electrode 61 are stacked in the order mentioned on the wafer 11. A resist is applied on the obtained laminate and patterned into a predetermined shape, and the etching is then performed. The lower electrode 12 and the upper electrode 61 form the pair of electrode layers. In FIG. 1, each layer is stacked in the Z direction orthogonal to the XY-plane. Each layer is formed by, for example, a thin-film formation method such as sputtering or chemical vapor deposition (CVD).

The MTJ element 10 is originally prepared through the above manufacturing process, and, the wafer 11 is extracted in a predetermined manufacturing process, and quality evaluation is performed using the extracted sampling wafer 11. The "quality evaluation" means confirming the unevenness of each interface of a sample 30 to be described later, a foreign object adhering to the end of each interface of the sample 30, and etching damage generated in a patterning step.

The wafer 11 is made of silicon or the like but not limited thereto and may be made of glass or the like. The lower electrode 12 and the upper electrode 61 are formed of a non-magnetic metal. The lower electrode 12 and the upper electrode 61 are formed of, for example, tantalum (Ta), ruthenium (Ru), platinum (Pt), or the like. The reference layer 13 and the recording layer 15 are formed of a ferromagnetic material. The reference layer 13 and the recording layer 15 are formed of an alloy or the like, the alloy containing at least any one of cobalt (Co), nickel (Ni), iron (Fe), manganese (Mn), chrome (Cr), neodymium (Nd), gadolinium (Gd), samarium (Sm), terbium (Tb), europium (Eu), and dysprosium (Dy), for example. The reference layer 13 and the recording layer 15 are formed of FeCoB in the present embodiment. The reference layer 13 is formed of a ferromagnetic material with its magnetizing direction fixed. The recording layer 15 is formed of a ferromagnetic material with its magnetizing direction changeable. The tunnel barrier insulating film 14 is formed of an insulating material. The tunnel barrier insulating film 14 may be formed of, for example, magnesium oxide (MgO), aluminum oxide (AlO), zirconium dioxide ($ZrO_2$), hafnium oxide ($HfO_2$), silicon dioxide ($SiO_2$), or the like, or may be a ternary oxide such as MgAlO or an oxide made up of more elements. The tunnel barrier insulating film 14 is formed of MgO in the present embodiment. The cap layer 60 is formed of, for example, cobalt-iron-boron (CoFeB), tantalum (Ta), or ruthenium (Ru).

The thickness of the MTJ element 10 is preferably in the range of 10 nm or greater and 200 nm or smaller, and more preferably in the range of 30 nm or greater and 50 nm or smaller. The thickness direction of the MTJ element 10 is a direction orthogonal to a direction in which each layer is stacked (Z direction). In the present embodiment, the thickness of the MTJ element 10 is set to 50 nm. The MTJ element 10 is formed into, for example, a conical, cylindrical, pyramid, or prismatic shape. In the present embodiment, the MTJ element 10 is formed into the conical shape, and the diameter of the bottom surface of the MTJ element 10 is taken as the thickness.

At least one of a conductive foreign object and an insulating foreign object adheres to the MTJ element 10 as a foreign object that induces degradation in properties of the MTJ element 10. When the conductive foreign object and the insulating foreign object are not distinguished, each of these is referred to as a foreign object. FIG. 1 only shows conductive foreign objects but shows no insulating foreign object. For the sake of description, numeral 16 has been added to a conductive foreign object formed across the reference layer 13, the tunnel barrier insulating film 14, and the recording layer 15, and numeral 17 has been added to a conductive foreign object formed on the reference layer 13 or the recording layer 15. The conductive foreign objects 16, 17 are formed on the surface of the MTJ element 10 in FIG. 1 but not limited thereto and may be formed inside the MTJ element 10. Each of the conductive foreign objects 16, 17 is formed as follows, for example: a part of the lower electrode 12 is etched by the etching performed in the patterning step and re-adheres to the surface of the MTJ element 10. Each of the conductive foreign objects 16, 17 is also formed as follows: a reaction byproduct, generated at the time of etching, remains on or re-adheres to the surface of the MTJ element 10. The conductive foreign object 16 adheres to the end of the tunnel barrier insulating film 14 and forms a path for a leakage current between the reference layer 13 and the recording layer 15 to short-circuit the reference layer 13 and the recording layer 15. The short circuit of the reference layer 13 and the recording layer 15 causes deterioration in magnetoresistive change rate of the MTJ element 10. Examples of the constituent elements of the conductive foreign object that induces degradation in properties of the MTJ element 10 include Fe, Co, Ti, Pt, Mg, Si, W, Hf, Zr, Ba, B, Mo, Pd, Ir, Al, Mn, Te, Ni, Nd, Gd, Cr, Sm, Eu, and Dy, besides Ru and Ta. The insulating foreign object is formed as follows, for example; a part of the tunnel barrier insulating film 14 is etched by etching performed in the patterning step and re-adheres to the surface of the MTJ element 10. When the insulating foreign object adheres to the end of the tunnel barrier insulating film 14, the insulating foreign object may be diffused to the inside of the tunnel barrier insulating film 14 by thermal treatment after the adhesion to cause degradation in crystallinity of the tunnel barrier insulating film 14. The degradation in crystallinity of the tunnel barrier insulating film 14 leads to deterioration in magnetoresistive change rate of the MTJ element 10 as in the case of formation of a damaged layer 18 to be described later. Examples of the constituent elements of the insulating foreign object that induces degradation in properties of the MTJ element 10 include N, C, F, O, Ar, Kr, Xe, Ne, He, H, and Cl. These foreign objects depend greatly on etching conditions, have various sizes ranging from nm or smaller to as great as several microns, and adhere to the side wall of the MTJ element 10 at random.

Figure 2:
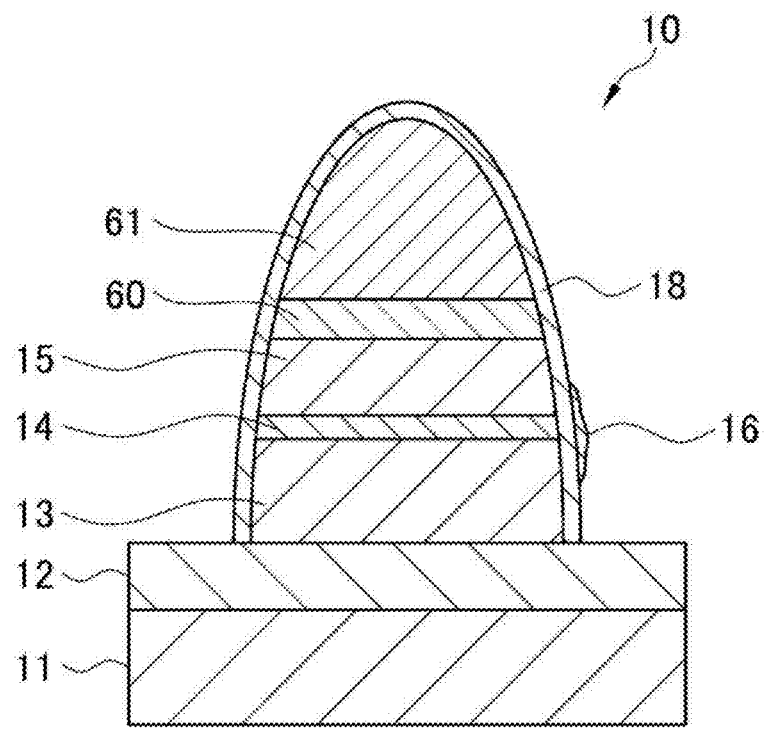
FIG. 2 is a sectional schematic view cut along a line II-II of FIG. 1.

As shown in FIG. 2, in the MTJ element 10, the damaged layer 18 is formed due to the etching damage having occurred in the etching performed in the patterning step. In this example, the damaged layer 18 is formed over the entire surface, or in a peculiar place, of the MTJ element 10. The damaged layer 18 described here is an area in the reference layer 13 and the recording layer 15, in which the crystalline structure has been physically destroyed by etching. However, the damaged layer 18 in a broader sense is a physico-chemically altered area formed by impurities entering the tunnel barrier insulating film 14 to such an extent as to hinder the tunneling of electrons. This means that an area in which coherent tunneling does not occur has been generated due to the crystallographic inconsistency of the altered area in the tunnel barrier insulating film 14 with the interface area between the reference layer 13 and the recording layer 15 which is in contact with the altered area. Thus, the tunnel magnetoresistive effect resultantly decreases in the area where the coherent tunneling does not occur. Moreover, when the crystallographically accumulated state of oxygen and the magnetic element in the interface area collapses, vertical magnetization derived from a mixed track of oxygen and the magnetic element is lost. Hence in the damaged layer 18, as compared to an area in which the crystalline structure is not destroyed, the magnetoresistive change rate and the vertical magnetic anisotropy deteriorate significantly in accordance with the degree of destruction of the crystalline structure. Therefore, when the damaged layer 18 is generated, the magnetoresistive change rate of the MTJ element 10 falls below a designed value, and desired thermal qualitative stability is not obtained. A method for accurately performing quantitative measurement of the damaged layer 18 has not hitherto been established. There has only been established a one-dimensional qualitative evaluation method as described in "Precise damage observation in ion-beam etched MTJ" where, by using a transmission electron microscope (TEM), the end of the tunnel barrier insulating film 14 is irradiated with electrons, and from the diffraction pattern thereof, the crystallinity is evaluated.

Although not shown in FIG. 2, the lower electrode 12 has a grain boundary and has the surface with fine unevenness formed thereon. The grain boundary of the lower electrode 12 reflects the unevenness to the tunnel barrier insulating film 14 to cause its film thickness to vary. That is, the tunnel barrier insulating film 14 is influenced by the unevenness of the lower electrode 12, to have the unevenness on the surface. At this time, the film thickness of the tunnel barrier insulating film 14 formed on the unevenness of the lower electrode 12 becomes nonuniform. When arithmetic mean estimation (Ra) is about 0.2 nm or smaller, the high functionality as the MTJ element 10 can be kept, that is, the tunneling properties of electrons are not lost. When the film thickness of the tunnel barrier insulating film 14 is extremely small, the electric field concentration occurs to cause the withstand voltage to decrease and a leakage current to flow, and hence normal operation cannot be expected.

Figure 3A:
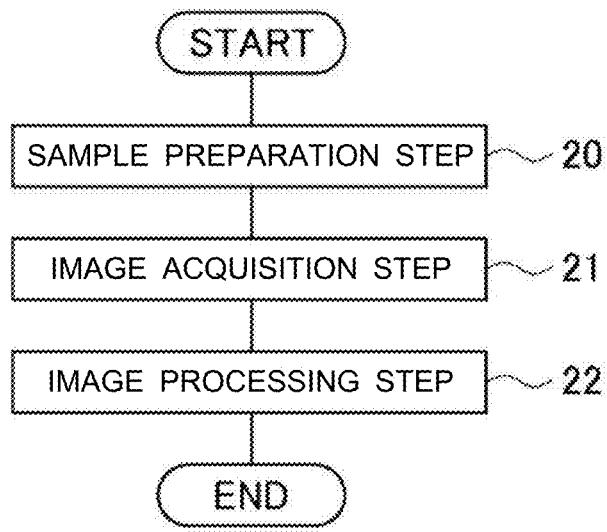
FIG. 3A is a flowchart showing an evaluation method for an electronic device according to the present invention.
Figure 3B:
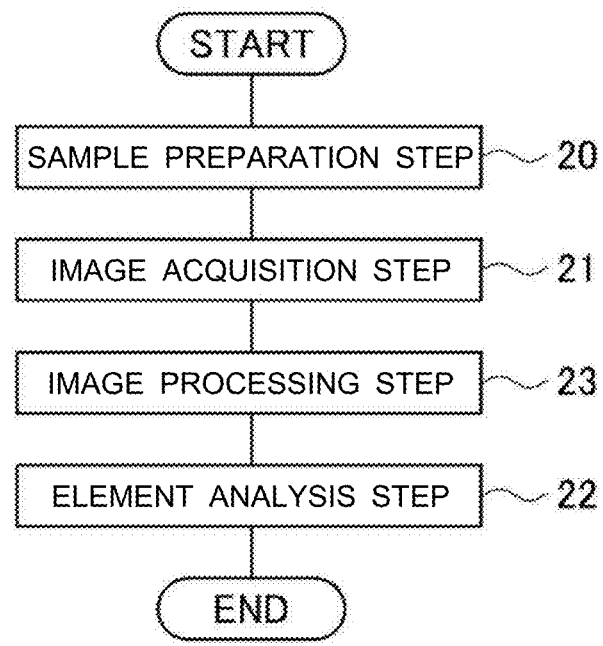
FIG. 3B is a flowchart showing an evaluation method for an electronic device, the method having an element analysis step.

As shown in FIG. 3A, the evaluation method for the MTJ element 10 as the electronic device at least includes a sample preparation step 20, an image acquisition step 21, and an image processing step 22. In the case of the present embodiment, as shown in FIG. 3B, the evaluation method further includes an element analysis step 23 in addition to the sample preparation step 20, the image acquisition step 21, and the image processing step 22. The element analysis step 23 is performed between the image acquisition step 21 and the image processing step 22. Hereinafter, the sample preparation step 20, the image acquisition step 21, the element analysis step 23, and the image processing step 22 will be described in the order mentioned.

Figure 4:
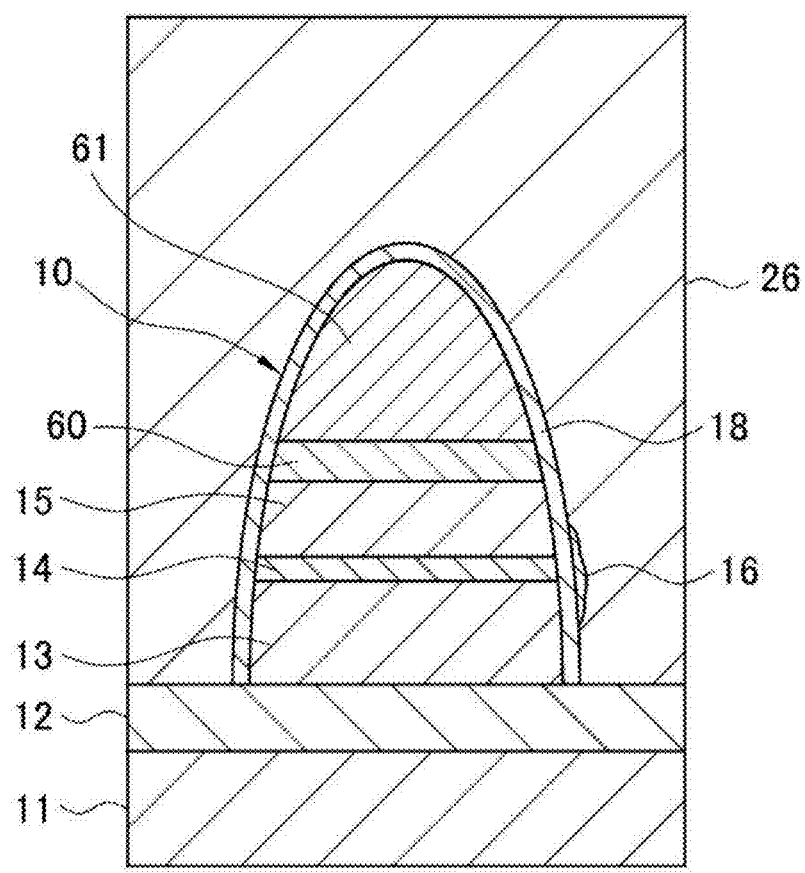
FIG. 4 is a pattern view showing a cross-section of an MTJ element formed with an evaluating protective film.

In the sample preparation step 20, first, an element formation area (not shown) is cut out of the wafer 11 to form a chip having a plurality of MTJ elements 10, and as shown in FIG. 4, an evaluating protective film 26 is formed on the surface of the MTJ element 10 on the chip. The evaluating protective film 26 is formed of, for example, resin or the like. Next, chips are processed using a FIB apparatus (not shown) to cut one MTJ element 10 out of the plurality of MTJ elements 10 on the chip.

Figure 5:
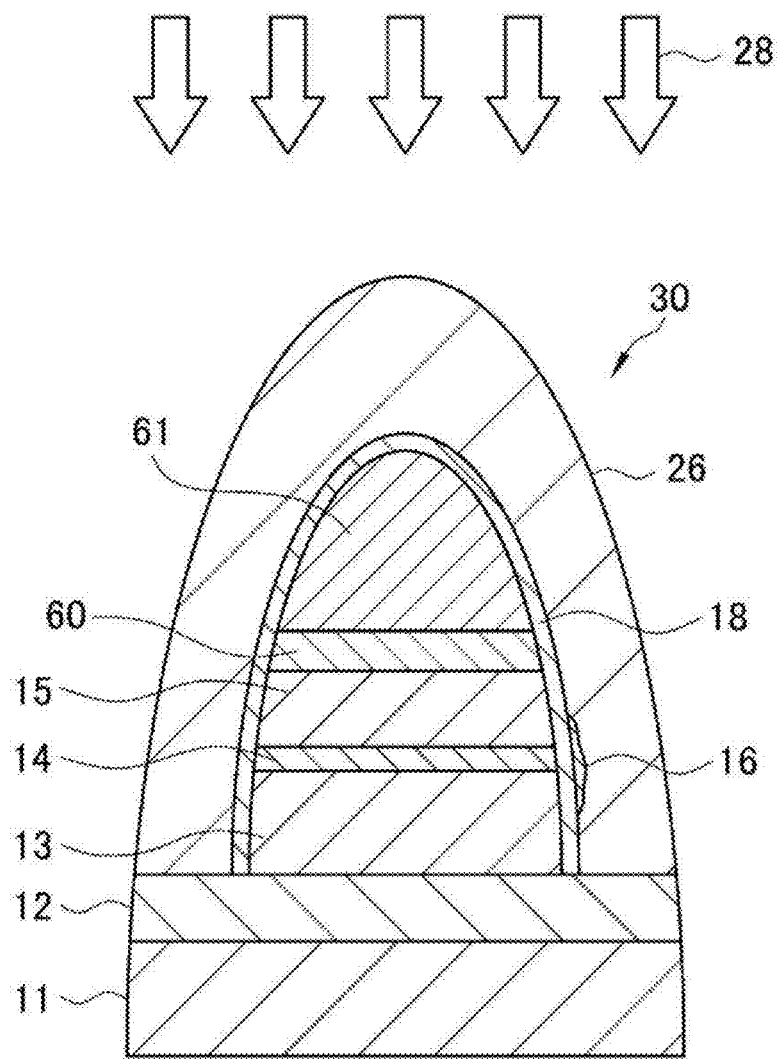
FIG. 5 is a pattern view showing a cross-section of a sample.

As shown in FIG. 5, the cut-out MTJ element 10 is introduced into an ion-milling apparatus (not shown). As shown in FIG. 5, in the ion-milling apparatus, the evaluating protective film 26 is etched with ion beams 28 so that the surface of the MTJ element 10 is not exposed. The etching of the evaluating protective film 26 is performed while the MTJ element 10 is rotated. Thereby, a sample 30 having the tunnel barrier insulating film 14 is prepared. The conductive foreign object 16 adheres to the sample 30 obtained by processing the MTJ element 10 as thus described, and the damaged layer 18 is formed in the sample 30. The sample 30 is formed into, for example, a conical, cylindrical, pyramid, or prismatic shape. In this example, the sample 30 is formed in the conical shape. In the sample preparation step 20, the sample 30 formed with the evaluating protective film 26 for protecting the MTJ element 10 is formed in this example, but the sample 30 is not limited thereto, and a sample not formed with the evaluating protective film 26 may be prepared. That is, in the sample preparation step 20, the sample having the insulating film provided between the pair of electrode layers is prepared, and the sample including the evaluating protective film for protecting the above sample is prepared.

Figure 6:
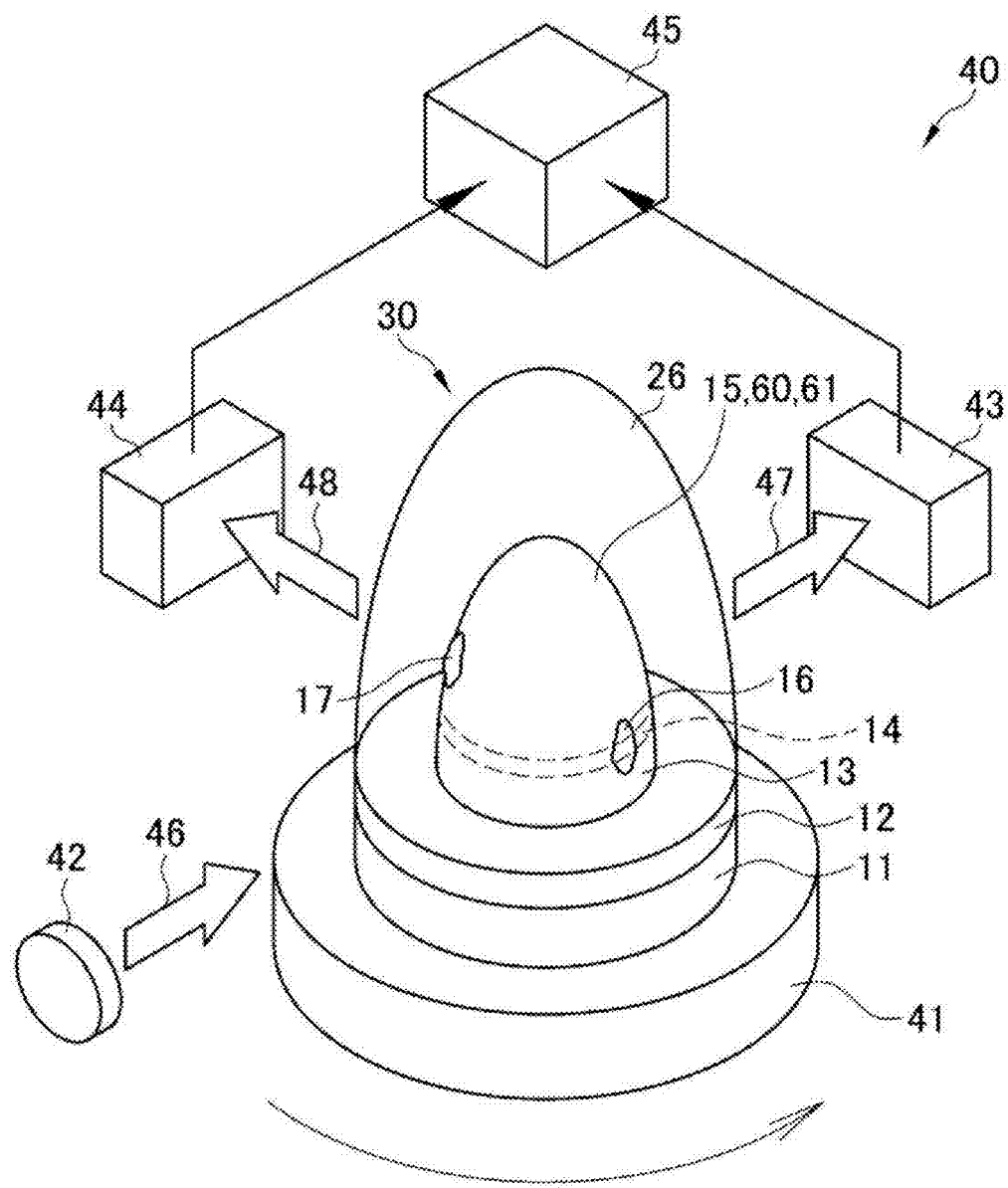
FIG. 6 is a schematic view of an evaluation apparatus.

The image acquisition step 21, the element analysis step 23, and the image processing step 22 are performed using the evaluation apparatus 40 shown in FIG. 6, for example. The evaluation apparatus 40 has the TEM for observing the cross-section of the sample 30. In this example, a scanning transmission electron microscope (STEM) is used as the transmission electron microscope. The evaluation apparatus 40 includes a sample holder 41, an electron source 42, an image acquisition unit 43, an element analysis unit 44, and an image processing unit 45. The sample holder 41 rotates in the state of holding the sample 30. The electron source 42 outputs electron beams 46 to the sample 30 from a plurality of angles. The image acquisition unit 43 detects the electron beams 47 transmitted through the sample 30 to acquire a plurality of STEM images. The element analysis unit 44 performs element analysis of the sample 30. Using the STEM images and the analysis results of the element analysis, the image processing unit 45 generates an image for evaluating the MTJ element 10. Note that the evaluation apparatus 40 at least includes the electron source 42, the image acquisition unit 43, and the image processing unit 45, and may not include the element analysis unit 44.

In the image acquisition step 21, the sample 30 is irradiated with the electron beams 46 while the sample 30 is rotated with the sample holder 41. The sample holder 41 is rotated by 360 degrees. The sample 30 is two-dimensionally irradiated with the electron beams 46 from different angles within the horizontal plane and is also irradiated vertically with electrons by scanning with the electron beams 46, thereby enabling three-dimensional irradiation. Accordingly, a plurality of STEM images with different irradiation angles of the electron beams 46 are acquired. That is, in the image acquisition step 21, the sample 30 is irradiated with the electron beams 46 from a plurality of angles, to acquire a plurality of images. As thus described, the sample 30 installed on the sample holder 41 is rotated, to acquire information on transmitted electrons at each angle, and the information is three-dimensionally reconstructed, whereby the stereoscopic structure can be observed from various directions.

In the element analysis step 23, the element analysis is performed on the sample 30 irradiated with the electron beams 46. In this example, in the element analysis step 23, characteristic X-rays 48, emitted by the sample 30 due to the irradiation with the electron beams 46, are detected and energy dispersive X-ray spectroscopy (EDX) is performed in the element analysis unit 44. In the element analysis step 23, in addition to, or instead of, the energy dispersive X-ray spectroscopy, electron energy loss spectroscopy (EELS) may be performed to detect the electron energy loss spectrums of the electron beams transmitted through the sample 30.

The image processing step 22 will be described with reference to FIGS. 7 to 10. The image processing step 22 is performed in the image processing unit 45, and the image processing is performed using a plurality of images to reconstruct a stereoscopic image 50 of the sample 30 and generate a cross-sectional image of the sample 30 from the stereoscopic image 50. The cross-sectional image is generated using a tomography method, for example. In the image processing step 22, it is possible to observe a cross-section obtained when the sample 30 is sliced at an arbitrary position. The slicing position of the sample 30 is set by a user via setting means, which is not shown.

Figure 7:
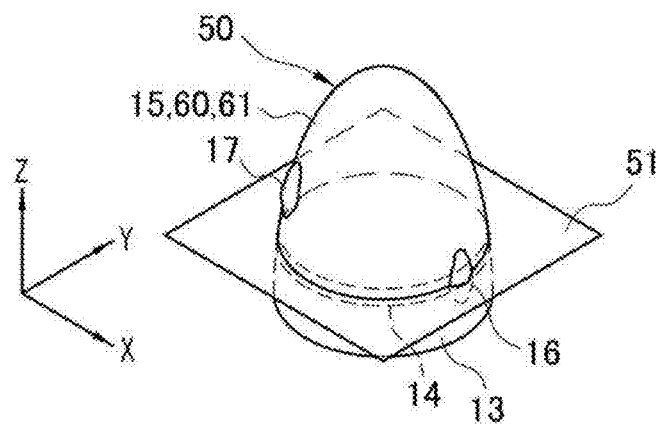
FIG. 7 is an explanatory view for explaining the generation of a horizontal cross-sectional image.

As shown in FIG. 7, in the image processing step 22, the stereoscopic image 50 of the sample 30 is reconstructed from the plurality of STEM images acquired in the image acquisition step 21. FIG. 7 shows an observation example of a cross-section parallel to the XY-plane. A slicing position 51 moves in the Z direction in accordance with the user's setting. In the case of this figure, the slicing position 51 is set at the position of the tunnel barrier insulating film 14.

Figure 8:
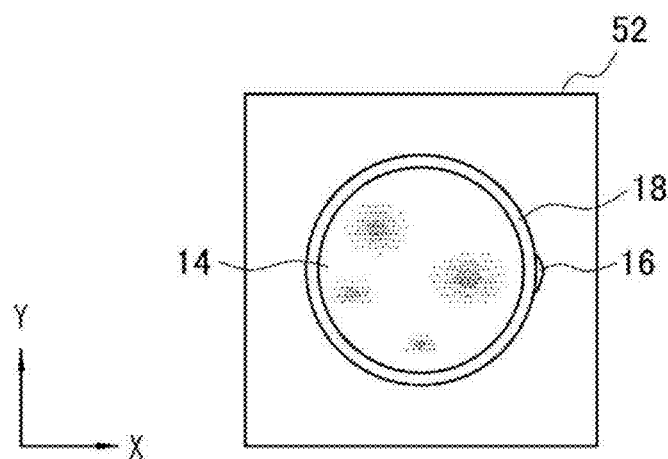
FIG. 8 is a pattern view of the horizontal cross-sectional image.

As shown in FIG. 8, at the slicing position 51, a cross-sectional image 52 of the sample 30 is generated from the stereoscopic image 50. The cross-sectional image 52 is a horizontal cross-sectional image of the sample 30. In this example, the cross-sectional image 52 is a horizontal cross-sectional image of the tunnel barrier insulating film 14 portion. In the cross-sectional image 52, each of boundaries among the tunnel barrier insulating film 14, the conductive foreign object 16, and the damaged layer 18 appears clearly. The cross-sectional image 52 is displayed on a monitor, which is not shown.

The cross-sectional image 52 includes a part of the reference layer 13 or a part of the recording layer 15 besides the tunnel barrier insulating film 14, and these appear with different shades. With the shades of the cross-sectional image 52, it is possible to facilitate confirming the presence or absence of the unevenness of the tunnel barrier insulating film 14 over the entire surface of the tunnel barrier insulating film 14. Further, the slicing position 51 is moved in the Z direction, and the cross-sectional image 52 at each slicing position 51 is sequentially displayed on the monitor, whereby the unevenness of each interface of the sample 30 can be evaluated.

In the cross-sectional image 52, there appears the entire circumferential area of the tunnel barrier insulating film 14. Therefore, even when the conductive foreign objects 16 are formed at random on the circumference of the tunnel barrier insulating film 14, it is possible to facilitate confirming the presence or absence of the conductive foreign object 16.

Figure 9:
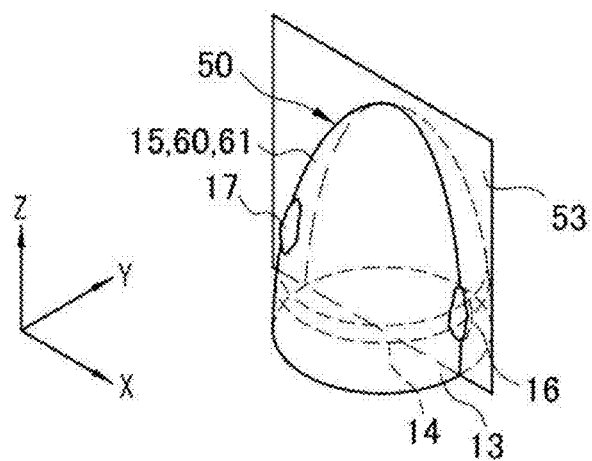
FIG. 9 is an explanatory view for explaining the generation of a vertical cross-sectional image.

FIG. 9 shows an observation example of a cross-section parallel to the XZ-plane. A slicing position 53 moves in the Y direction in accordance with the user's setting. In the case of this figure, the slicing position 53 is set at a position corresponding to roughly the center of the sample 30.

Figure 10:
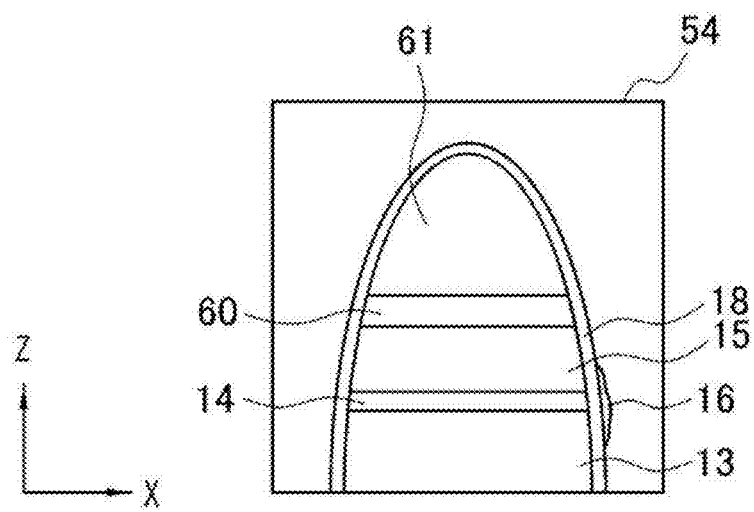
FIG. 10 is a pattern view of the vertical cross-sectional image.

As shown in FIG. 10, at the slicing position 53, a cross-sectional image 54 of the sample 30 is generated from the stereoscopic image 50. The cross-sectional image 54 is a vertical cross-sectional image of the sample 30 at the slicing position 53. In this example, the cross-sectional image 54 is a vertical cross-sectional image including the conductive foreign object 16 portion. In the cross-sectional image 54, each of boundaries among the reference layer 13, the tunnel barrier insulating film 14, the recording layer 15, the cap layer 60, the upper electrode 61, the conductive foreign object 16, and the damaged layer 18 appears clearly. From the cross-sectional image 54 of the slicing position 53, the cross-section of the conductive foreign object 16 is detected, and the conductive foreign object 17 is not detected. The cross-sectional image 54 is displayed on the monitor, which is not shown.

The slicing position 53 is moved in the Y direction, and the cross-sectional image 54 at each slicing position 53 is sequentially displayed on the monitor, whereby it is possible to evaluate the conductive foreign object and the insulating foreign object as the foreign objects adhering to the end of each interface of the sample 30. Further, the distribution and the thickness of the damaged layer 18 can also be confirmed, thereby enabling evaluating the etching damage that occurs in the patterning step.

Figure 11:
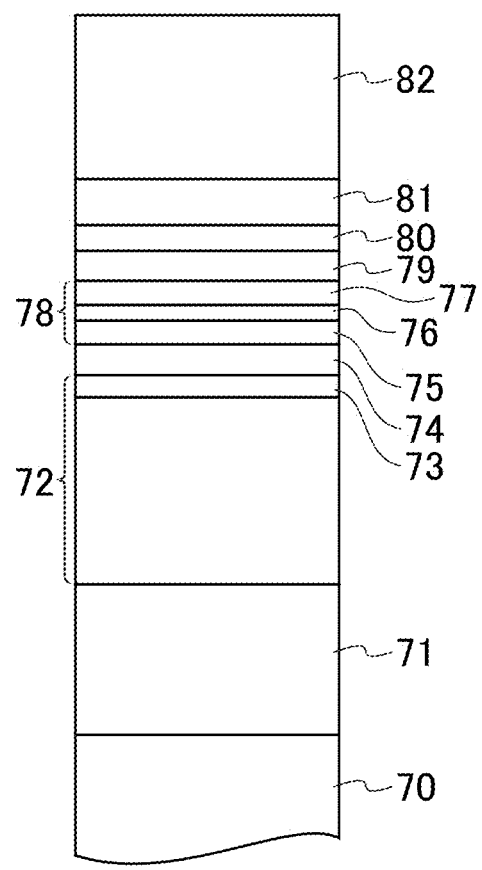
FIG. 11 is a schematic view showing the structure of the sample.

FIG. 11 shows the structure of the sample used in the present example. The present example shows the case in which the tunnel barrier insulating film is double-layered, but, needless to say, a similar effect is also exerted when a single-layered tunnel barrier insulating film is stacked. In the same figure, the sample is made up of a thermally oxidized silicon substrate 70, a lower electrode 71, a reference layer 72, an uppermost layer 73 of the reference layer 72, a tunnel barrier insulating film 74, a recording layer 78 formed of a lowermost layer 75, a spacer 76, and an uppermost layer 77, a cap 79 of the recording layer 78, a cap layer 80 for protecting the cap 79, an upper electrode etching stopper 81, and an upper electrode 82. In the thermally oxidized silicon substrate 70, a thermally oxidized film is formed on the silicon substrate. The lower electrode 71 is formed of Ta, for example. The lower layer of the reference layer 72 is formed of a CoPt-based material. The uppermost layer 73 of the reference layer 72 is formed of CoFeB. The tunnel barrier insulating film 74 is formed of MgO. The lowermost layer 75 of the recording layer 78 is formed of CoFeB. The spacer 76 of the recording layer 78 is formed of Ta. The uppermost layer 77 of the recording layer 78 is formed of CoFeB. The cap 79 is made of a tunnel barrier insulating film that is formed of MgO. The cap layer 80 is formed of Ta. The upper electrode etching stopper 81 is formed of Ru. The upper electrode 82 is formed of Ta. The MTJ element provided between the lower electrode 71 and the upper electrode 82 formed on the thermally oxidized silicon substrate 70 has a structure in which the tunnel barrier insulating film 74 is sandwiched between the lowermost layer 75 of the recording layer 78 and the uppermost layer 73 of the reference layer 72. In the MTJ element, the spacer 76 is formed on the lowermost layer 75 of the recording layer 78 to keep the interface crystallinity between the tunnel barrier insulating film 74 and the lowermost layer 75 of the recording layer 78. Further, in the MTJ element, the cap 79 made of the same material as the tunnel barrier insulating film 74 is further formed on the uppermost layer 77 of the recording layer 78 via the spacer 76 to keep the interface crystallinity between the uppermost layer 77 of the recording layer 78 and the cap 79, thereby improving the vertical magnetic anisotropy twice as high. At that time, for keeping the interface crystallinity between the uppermost layer 77 of the recording layer 78 and the cap 79, the cap layer 80 is formed to protect the cap 79 of the recording layer 78. Then, the upper electrode etching stopper 81 is formed as the etching stopper for the upper electrode 82, and lastly, the upper electrode 82 is formed. Needless to say, all the films but the tunnel barrier insulating film are non-insulating films. Although not described in the present example, a protective film is typically formed on the surface of the MTJ element.

Each of FIGS. 12A to 12D is a STEM-EDX tomographic image according to the present invention, showing an example of using an actual MTJ material system. Each of FIGS. 12A to 12D shows an example of a stereoscopic image (on the left) generated from the reference layer 72 to the upper electrode 82 in order with respect to the sample in which the double-layered tunnel barrier insulating film is provided between the reference layer 72 and the recording layer 78 as shown in FIG. 11, and a horizontal cross-sectional image (on the right) at a different slicing position. These are images each formed as follows: a high-angle annular dark field-STEM (HAADF-STEM) image, which is a result obtained by scanning and irradiating the sample with finely reduced electron beams and detecting diffused electrons at high angles out of transmitted electrons with an annular detector, is synthesized with results obtained by rotating the sample by 4 degrees each. In the HAADF-STEM image, a heavy element appears bright, so that contrast proportional to an atomic weight (Z) is obtained in these figures as well.

Figure 12A:
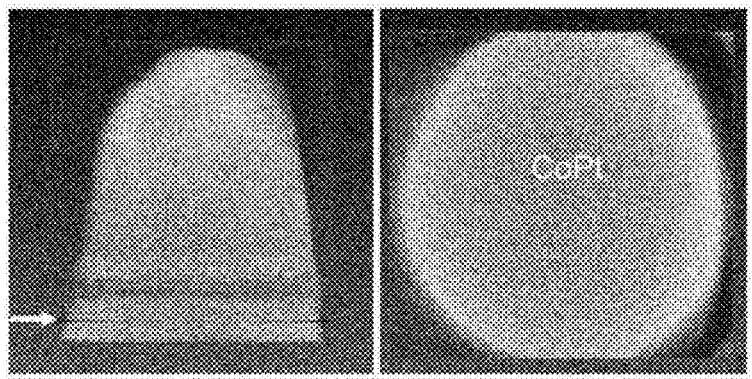
FIG. 12A is a horizontal cross-sectional image of a reference layer portion.

FIG. 12A shows a horizontal cross-sectional image in a case where the slicing position is set in the lower layer (CoPt-based) portion of the reference layer 72. It is found that this portion is made of a metal material constituting the lower layer of the reference layer 72 and homogeneous CoPt has been detected.

Figure 12B:
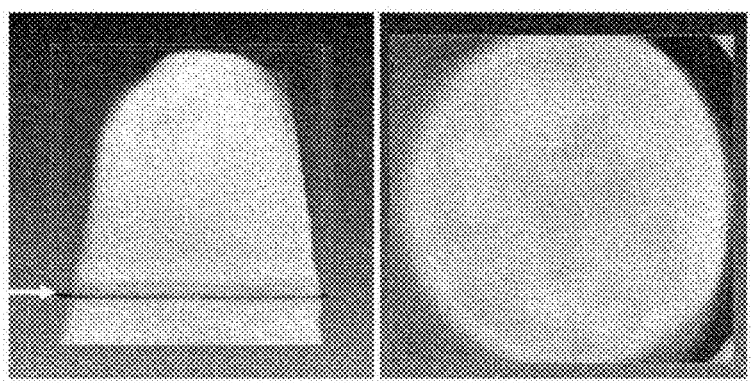
FIG. 12B is a horizontal cross-sectional image of an interface between the uppermost layer of the reference layer and a tunnel barrier insulating film.

FIG. 12B shows a horizontal cross-sectional image in a case where the slicing position is set in the interface between the uppermost layer 73 (CoFeB) of the reference layer 72 and the tunnel barrier insulating film 74 (MgO). Characteristic morphology having white-and-black shades of CoFeB and MgO has been obtained. With the present horizontal cross-sectional image being formed of data of a HAADF image, it is found that the morphology with white-and-black shades is a result of obtaining contrast of a HAADF signal (dark) of MgO and a HAADF signal (bright) of CoFeB. For evaluation of the interface roughness that exhibits the vertical magnetic anisotropy, there has been no method but to use one-dimensional unevenness information obtained with a normal TEM, and the present invention has made it possible for the first time to obtain two-dimensional unevenness information as thus described. Since the one-dimensional unevenness information lacks unevenness information of a place except for the area concerned, for obtaining actual interface unevenness information of the MTJ element in a three-dimensional manner, there is no method but to obtain the two-dimensional technique according to the present invention and construct three-dimensional unevenness information. By using the method according to the present invention as analysis means in the MTJ element formation process, it is possible to find a process condition for the minimum roughness of each interface in the MTJ element. When the interface roughness is present, the tunneling probability of electrons decreases sharply to cause degradation in interface vertical magnetic anisotropy, thus leading to deterioration in magnetoresistive change rate of the MTJ element.

Figure 12C:
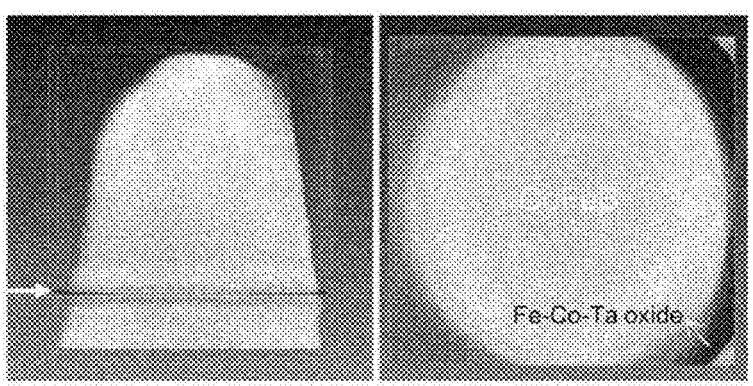
FIG. 12C is a horizontal cross-sectional image of an interface between a cap of a recording layer and a cap layer.

FIG. 12C shows a horizontal cross-sectional image in a case where the slicing position is set in the interface between the cap 79 (MgO) of the recording layer 78 and the cap layer 80 (Ta). Characteristic morphology having white-and-black shades of MgO and Ta has been obtained, and it is found that at this interface as well, the roughness is uniformly present inside the MTJ element. The difference in signal intensity between the circumferential portion and the inside of the MTJ element has been observed, thus making it clear that a damaged layer is present at the end of the interface.

Figure 12D:
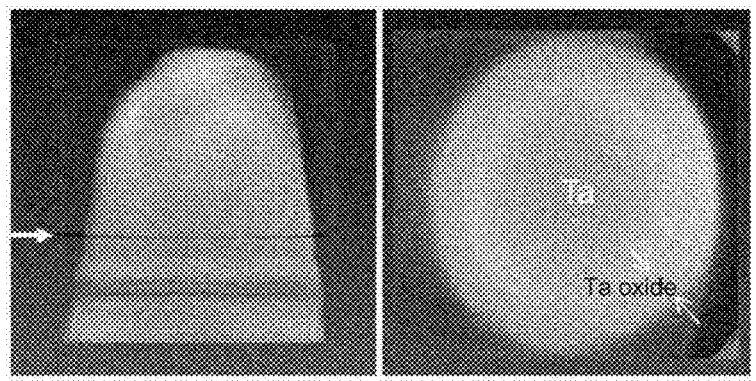
FIG. 12D is a horizontal cross-sectional image of an upper electrode portion.

FIG. 12D shows a horizontal cross-sectional image in a case where the slicing position is set in the upper electrode 82 (Ta) portion. It is found that the material (Ta) of the upper electrode 82 is uniformly distributed in this portion. Further, the difference in signal intensity between the circumferential portion and the inside of the MTJ element has been observed, thus making it clear that a damaged layer is present on the side surface portion of the MTJ element.

In the image processing step 22, element mapping images are generated using the analysis results of the element analysis unit 44 in the image processing unit 45. In this example, as the analysis results of the EDX, an element mapping image is obtained for each of oxygen (O), tantalum (Ta), magnesium (Mg), ruthenium (Ru), platinum (Pt), cobalt (Co), and iron (Fe). Each element mapping image is color-coded in accordance with the type of element. The element mapping image is displayed on the monitor, which is not shown.

Figure 13A:
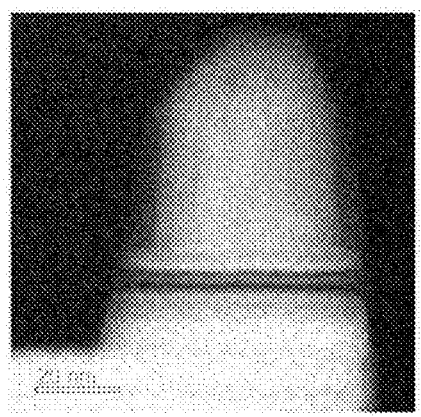
FIG. 13A is a STEM image of a sample provided with a double-layered tunnel barrier insulating film between the reference layer and the recording layer.
Figure 13B:
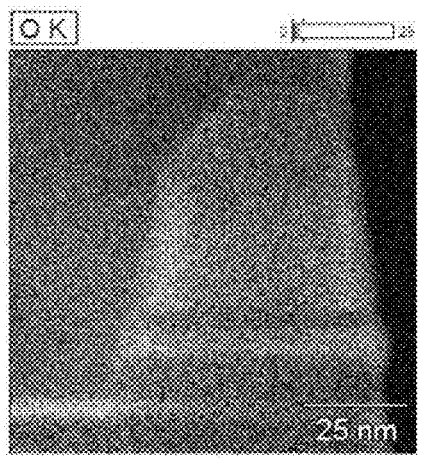
FIG. 13B is an element mapping image of oxygen.
Figure 13C:
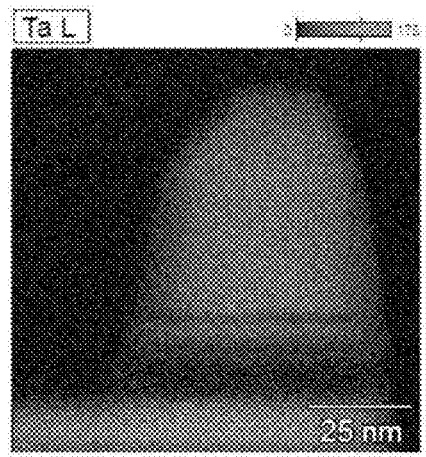
FIG. 13C is an element mapping image of tantalum.
Figure 13D:
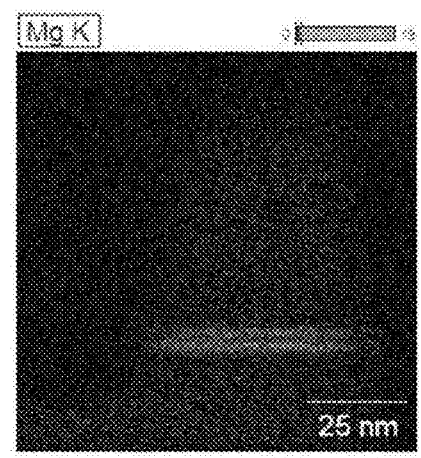
FIG. 13D is an element mapping image of magnesium.
Figure 13E:
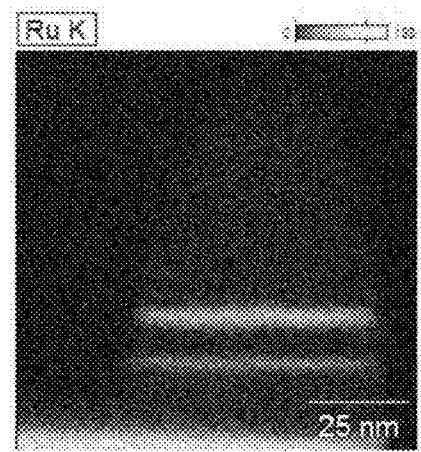
FIG. 13E is an element mapping image of ruthenium.
Figure 13F:
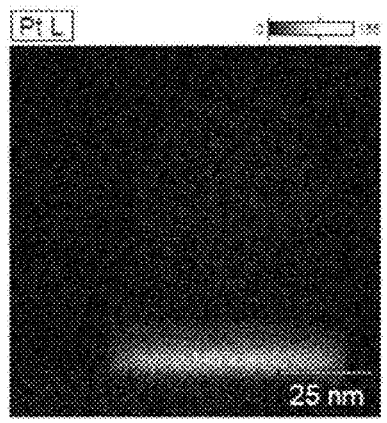
FIG. 13F is an element mapping image of platinum.
Figure 13G:
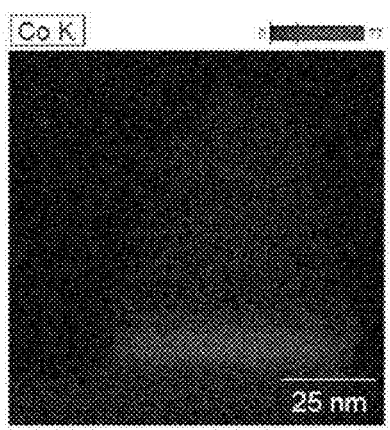
FIG. 13G is an element mapping image of cobalt.
Figure 13H:
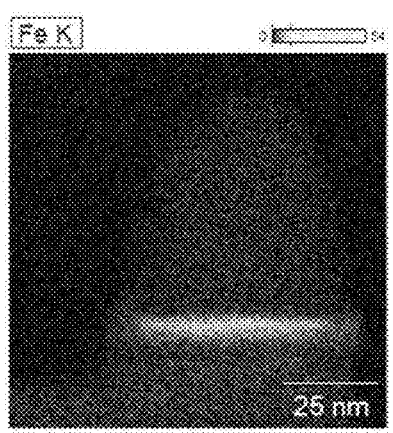
FIG. 13H is an element mapping image of iron.

FIGS. 13A to 13H are EDX analysis results of the sample provided with the double-layered tunnel barrier insulating film between the reference layer and the recording layer. FIG. 13A is a STEM image of the sample provided with the double-layered tunnel barrier insulating film between the reference layer and the recording layer. FIG. 13B is an element mapping image of oxygen. FIG. 13C is an element mapping image of tantalum. FIG. 13D is an element mapping image of magnesium. FIG. 13E is an element mapping image of ruthenium. FIG. 13F is an element mapping image of platinum. FIG. 13G is an element mapping image of cobalt. FIG. 13H is an element mapping image of iron. From the element mapping image of each of FIGS. 13B to 13H, the composition of each layer can be confirmed. In the element mapping image, the element in the conductive foreign object 16 can be identified, so that the generation source of the conductive foreign object 16 can be specified.

Figure 14A:
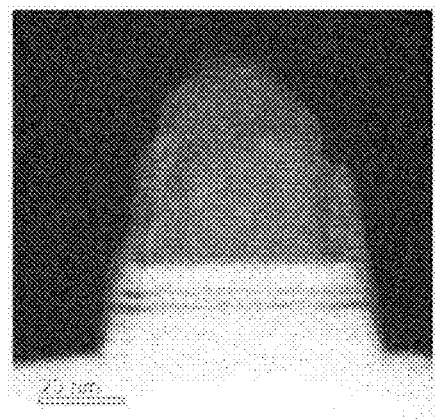
FIG. 14A is a vertical cross-sectional image of a HAADF-STEM tomographic image of an MTJ element to which a foreign object adheres.
Figure 14B:
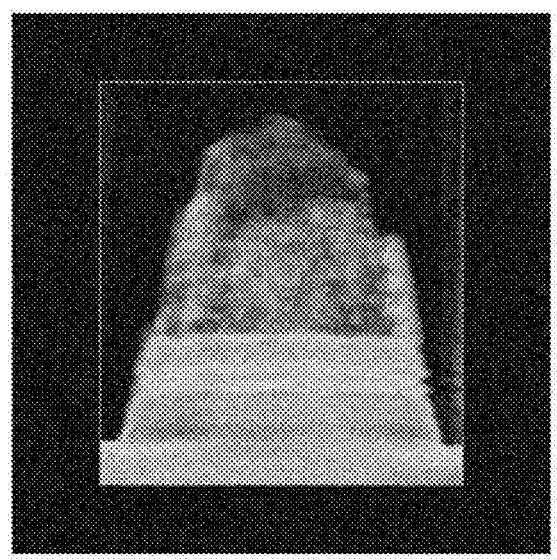
FIG. 14B is a vertical cross-sectional image of the HAADF-STEM tomographic image of an MTJ element, measured with increased contrast.
Figure 14C:
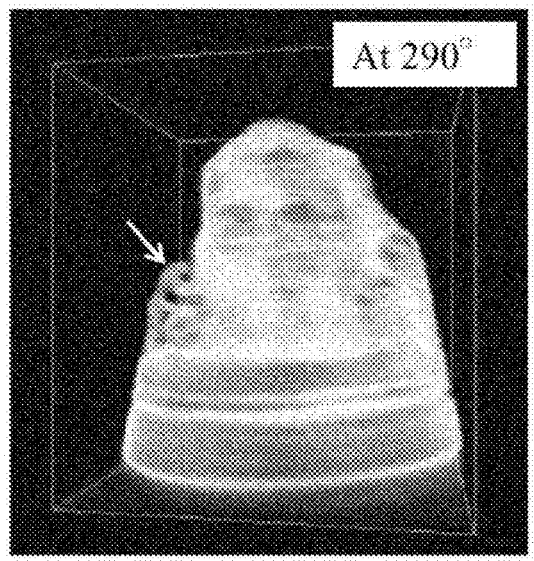
FIG. 14C is a HAADF-STEM tomographic image obtained by horizontally rotating FIG. 14A by 290°.
Figure 14D:
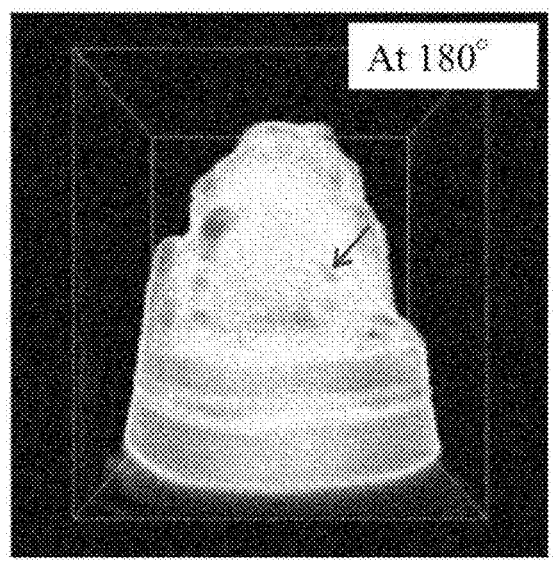
FIG. 14D is a HAADF-STEM tomographic image obtained by horizontally rotating FIG. 14A by 180°.
Figure 14E:
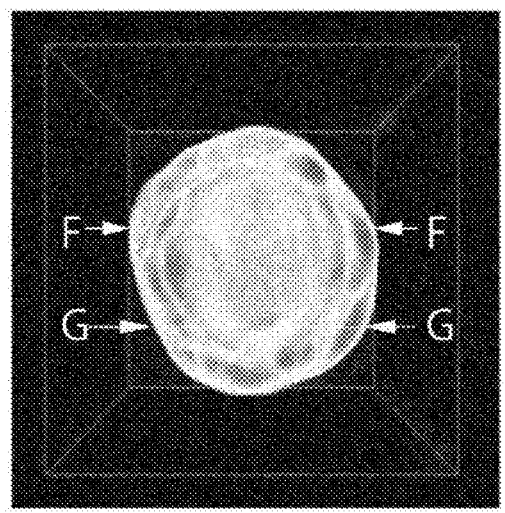
FIG. 14E is a HAADF-STEM tomographic image of the MTJ element as viewed from directly above.
Figure 14F:
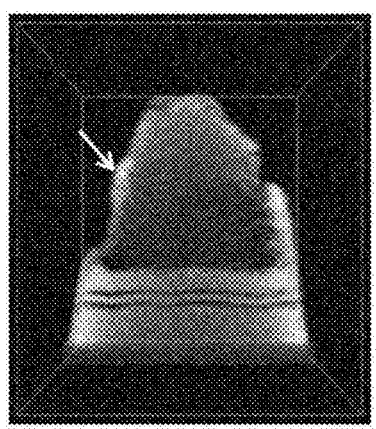
FIG. 14F is a vertical cross-sectional image along a line F-F of FIG. 14E.
Figure 14G:
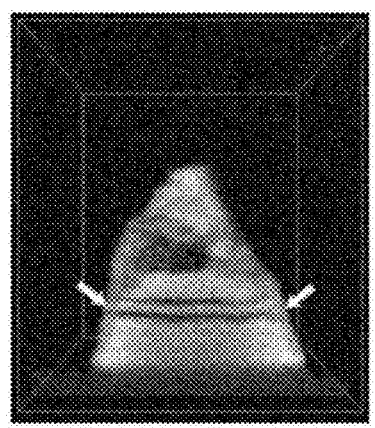
FIG. 14G is a vertical cross-sectional image along a line G-G of FIG. 14E.

FIGS. 14A to 14H show HAADF-STEM tomographic images in a case where foreign objects adhere to the side wall of the MTJ element, with the etching condition changed at the time of patterning the MTJ element. The structure of the MTJ element is different from the structure shown in FIGS. 11 to 13, and the constituent elements of the upper electrode are an element a and an element b which are different from Ta. FIG. 14A is a vertical cross-sectional image of the MTJ element, and FIG. 14B is a vertical cross-sectional image of the MTJ element, having been measured with increased contrast to observe the foreign object in more detail. FIG. 14C is a HAADF-STEM tomographic image obtained by horizontally rotating FIG. 14A by 290°. FIG. 14D is a HAADF-STEM tomographic image obtained by horizontally rotating FIG. 14A by 180°. From FIGS. 14C and 14D, there can be confirmed a state in which the foreign object (indicated by an arrow in FIG. 14D), which is identified when FIG. 14A is rotated by 180°, stereoscopically adheres to the side wall of the MTJ element when FIG. 14A is rotated by 290° (indicated by an arrow in FIG. 14C). FIG. 14E is a HAADF-STEM tomographic image of the MTJ element as viewed from directly above. From FIG. 14E, it is found that a foreign object is present in any direction. FIG. 14F is a vertical cross-sectional image along a line F-F of FIG. 14E. In FIG. 14F, a foreign object identified in FIG. 14D can be identified (indicated by an arrow in FIG. 14F). FIG. 14G is a vertical cross-sectional image along a line G-G of FIG. 14E. FIG. 14G has reliably captured a state in which foreign objects are present at the end of the MTJ element, indicated by arrows in the figure.

Figure 15:
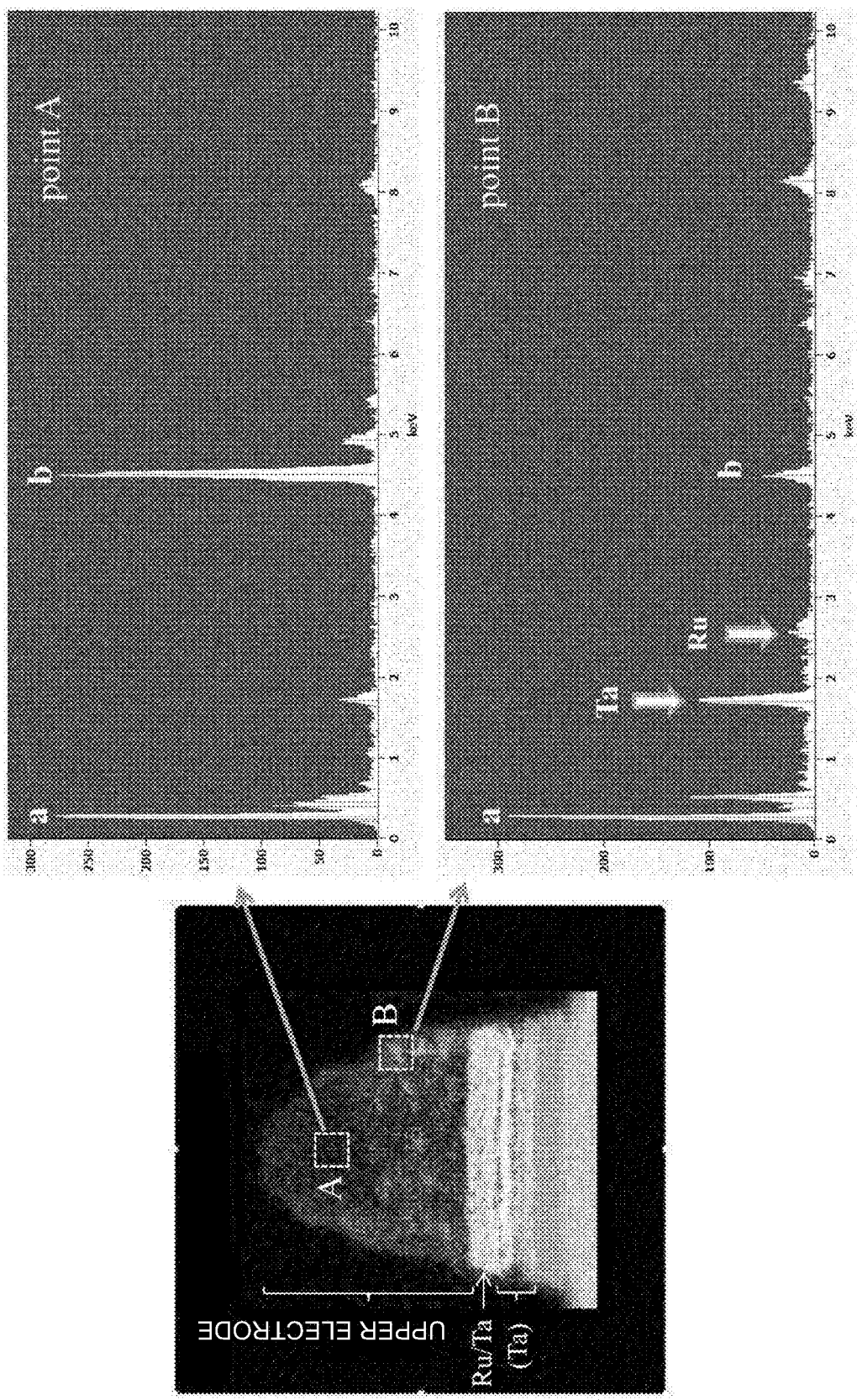
FIG. 15 shows a constituent element distribution image, which indicates a STEM-EDX tomographic image of the MTJ element and in which EDX signals are displayed overlapping the vertical cross-sectional image, and EDX spectrums at arbitrary points of the upper electrode.

FIG. 15 shows a STEM-EDX tomographic image, which indicates a constituent element distribution where an EDX signal of each element is displayed overlapping the vertical cross-sectional image of the MTJ element shown in FIG. 14A, and EDX spectrums at arbitrary points A, B of the upper electrode. At the point A, the element a and the element b in the material of the upper electrode have been mainly observed uniformly. At the point B, Ru and Ta have been detected, Ru being an element in the material of the upper electrode etching stopper, Ta being the material of the cap layer. In this MTJ element, Ta is also used in the lower layer portion. Areas in each of which Ru or Ta is detected are sparsely identified, and it is found therefrom that Ru and Ta are diffused on the upper electrode surface.

As described above, a cross-sectional image at an arbitrary position of the sample can be generated from a stereoscopic image, whereby it is possible to reliably observe the unevenness of the tunnel barrier insulating film, a foreign object, and etching damage, and accurately evaluate the quality of the electronic device. The evaluation method for an electronic device according to the present invention is especially effective for evaluation of an MTJ element in which a tunnel barrier insulating film is formed on a lower electrode having a grain boundary. Particularly in the horizontal cross-sectional image of the tunnel barrier insulating film portion, the unevenness of the tunnel barrier insulating film and a conductive foreign object can be identified simultaneously, to facilitate studying a cause of degradation in insulating properties of the tunnel barrier insulating film and taking measures against the degradation.

Moreover, the prior-process inspection can prevent the occurrence of a defect in a production lot and can, for example, significantly improve a process yield of an STT-MRAM equipped with an MTJ element. As the process size decreases with the advancement of electronic device miniaturization, increasing effects have been exerted on the quality of the electronic device by the unevenness of the tunnel barrier insulating film, a foreign object, and etching damage, so that the present invention is effective. It has been confirmed that, when the foreign object that induces degradation in properties of the MTJ element is a conductive foreign object, the foreign objects terminates the end of the tunnel barrier insulating film to cause a decrease in resistance of the MTJ element and hinder the tunnel properties. It has been confirmed that, when the foreign object that induces degradation in properties of the MTJ element is an insulating foreign object, the foreign object adheres to the end of the tunnel barrier insulating film and is then diffused to the inside of the tunnel barrier insulating film by thermal treatment after the adhesion, to disturb the crystallinity of the end of the tunnel barrier insulating film and lead to significant deterioration in magnetoresistive change rate, similarly to the damaged layer.

With each of the cross-sectional images 52, 54, the distribution and the depth of the damaged layer 18 can be understood clearly, which enables the quantitative evaluation of the damaged layer 18.

In the image processing step 22, the element mapping image may be generated using the analysis result of the electron energy loss spectroscopy in the image processing unit 45 in addition to, or instead of, the generation of the element mapping image by using the analysis result of the EDX.

REFERENCE SIGNS LIST

10 MTJ element
11 wafer
12 lower electrode
13 reference layer
14 tunnel barrier insulating film
15 recording layer
16, 17 conductive foreign object
18 damaged layer
30 sample
40 evaluation apparatus
42 electron source
43 image acquisition unit
44 element analysis unit
45 image processing unit
60 cap layer 61 upper electrode
70 thermally oxidized silicon substrate
71 lower electrode
72 reference layer
73 uppermost layer
74 tunnel barrier insulating film
75 lowermost layer
76 spacer
77 uppermost layer
78 recording layer
79 cap
80 cap layer
81 upper electrode etching stopper
82 upper electrode

What is claimed is:

1. An evaluation method for an electronic device provided with an insulating film between a pair of electrode layers, the method comprising:
   preparing a sample that has the insulating film;
   irradiating the sample with electron beams from a plurality of angles to acquire a plurality of images; and
   performing image processing using the plurality of images to reconstruct a stereoscopic image of the sample and generate a cross-sectional image of the sample from the stereoscopic image;
   wherein, between the electrode layers, the sample further has a recording layer formed of a ferromagnetic material and a reference layer formed of a ferromagnetic material; and
   wherein the insulating film is a tunnel barrier insulating film provided between the recording layer and the reference layer; and
   wherein the electron beams from the plurality of angles irradiate the sample from directions horizontal to the tunnel barrier insulating film.

2. The evaluation method for the electronic device according to claim 1, wherein each of the pair of electrode layers has a grain boundary, and the tunnel barrier insulating film has unevenness on the surface.

3. The evaluation method for the electronic device according to claim 1, wherein at least one of a conductive foreign object that short-circuits the recording layer and the reference layer and an insulating foreign object that causes degradation in crystallinity of the tunnel barrier insulating film adheres to the sample.

4. The evaluation method for the electronic device according to claim 1, wherein a horizontal cross-sectional image of the tunnel barrier insulating film is generated as the cross-sectional image.

5. The evaluation method for the electronic device according to claim 1, wherein the plurality of images are acquired with a transmission electron microscope.

6. The evaluation method for the electronic device according to claim 5, wherein a scanning transmission electron microscope is used as the transmission electron microscope.

7. The evaluation method for the electronic device according to claim 1, wherein the cross-sectional image is generated using a tomography method.

8. The evaluation method for the electronic device according to claim 1, the method further comprising performing element analysis on the sample irradiated with the electron beams, wherein an element mapping image is generated using a result of the element analysis.

9. The evaluation method for the electronic device according to claim 8, wherein the element analysis is performed by energy dispersive X-ray spectroscopy.

10. The evaluation method for the electronic device according to claim 9, wherein the element analysis is performed by electron energy loss spectroscopy.

11. The evaluation method for the electronic device according to claim 1, wherein a damaged layer generated by etching is formed in the sample.

12. The evaluation method for the electronic device according to claim 1, wherein an unevenness of each of interfaces of the sample, a foreign object adhering to an end of each of the interfaces of the sample, and etching damage generated in a patterning step are evaluated.

13. An evaluation apparatus for an electronic device provided with a lower electrode, a reference layer formed of a ferromagnetic material, a tunnel barrier insulating film, a recording layer formed of a ferromagnetic material, an upper electrode, stacked in this order, the apparatus comprising:
   an electron source configured to output electron beams to a sample having the tunnel barrier insulating film from a plurality of angles;
   an image acquisition unit configured to detect the electron beams transmitted through the sample to acquire a plurality of images; and
   an image processing unit configured to reconstruct a stereoscopic image of the sample from the plurality of images and generates a cross-sectional image of the sample from the stereoscopic image; and
   wherein the electron beams from the plurality of angles irradiate the sample from directions horizontal to the tunnel barrier insulating film.

14. The evaluation method for the electronic device according to claim 1, the method further comprising performing element analysis on the sample irradiated with the electron beams,
   wherein an element mapping image is generated using a result of the element analysis.

15. The evaluation method for the electronic device according to claim 1, wherein an evaluating protective film is formed along the surface of the electronic device.

* * * * *